United States Patent
Kittl et al.

(10) Patent No.: US 9,893,187 B2
(45) Date of Patent: Feb. 13, 2018

(54) SACRIFICIAL NON-EPITAXIAL GATE STRESSORS

(71) Applicant: Samsung Electronics Co., Ltd., Suwon-si, Gyeonggi-do (KR)

(72) Inventors: Jorge A. Kittl, Round Rock, TX (US); Chris Bowen, Austin, TX (US); Kiyotaka Imai, Seongnam-si (KR); Mark S. Rodder, Dallas, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/342,008

(22) Filed: Nov. 2, 2016

(65) Prior Publication Data

US 2017/0345932 A1 Nov. 30, 2017

Related U.S. Application Data

(60) Provisional application No. 62/341,004, filed on May 24, 2016.

(51) Int. Cl.

| H01L 21/00 | (2006.01) |
|---|---|
| H01L 29/78 | (2006.01) |
| H01L 29/66 | (2006.01) |
| H01L 29/786 | (2006.01) |

(52) U.S. Cl.
CPC ...... *H01L 29/7848* (2013.01); *H01L 29/6656* (2013.01); *H01L 29/66545* (2013.01); *H01L 29/66795* (2013.01); *H01L 29/7851* (2013.01); *H01L 29/7869* (2013.01)

(58) Field of Classification Search
CPC ............ H01L 29/7848; H01L 29/7851; H01L 29/7869; H01L 29/66795
USPC ......................................................... 438/104
See application file for complete search history.

(56) References Cited

U.S. PATENT DOCUMENTS

| 6,936,516 | B1 | 8/2005 | Goo et al. |
|---|---|---|---|
| 8,481,379 | B2 | 7/2013 | Liang et al. |
| 8,847,281 | B2 | 9/2014 | Cea et al. |
| 8,928,093 | B2 | 1/2015 | Lo et al. |
| 9,153,668 | B2 | 10/2015 | Ching et al. |
| 9,240,484 | B2 | 1/2016 | Kelly et al. |
| 9,263,342 | B2 | 2/2016 | Lee et al. |
| 9,331,148 | B1 | 5/2016 | Doris et al. |
| 2013/0200468 | A1 | 8/2013 | Cai et al. |
| 2014/0027816 | A1* | 1/2014 | Cea ................... H01L 29/66545 257/192 |
| 2014/0252481 | A1* | 9/2014 | Flachowsky ...... H01L 29/42392 257/349 |
| 2015/0162445 | A1 | 6/2015 | Wu et al. |
| 2015/0255543 | A1 | 9/2015 | Cheng et al. |
| 2015/0364603 | A1 | 12/2015 | Cheng et al. |
| 2016/0104799 | A1 | 4/2016 | Qi et al. |

(Continued)

*Primary Examiner* — Vu A Vu
(74) *Attorney, Agent, or Firm* — Lewis Roca Rothgerber Christie LLP

(57) ABSTRACT

A method for fabricating a fin field effect transistor (finFET) device with a strained channel. During fabrication, after the fin is formed, a dummy gate is deposited on the fin, and processed, e.g., by plasma doping and annealing, to cause stress in the dummy gate. Deep source drain (SD) recesses are formed, resulting in strain in the channel, and SD structures are formed to anchor the ends of the fin. The dummy gate is then removed.

20 Claims, 9 Drawing Sheets

(56) References Cited

U.S. PATENT DOCUMENTS

2016/0118472 A1     4/2016   Qi
2016/0329321 A1*   11/2016   Shi .................... H01L 27/0629

* cited by examiner

US 9,893,187 B2

SACRIFICIAL NON-EPITAXIAL GATE STRESSORS

CROSS-REFERENCE TO RELATED APPLICATION(S)

The present application claims priority to and the benefit of U.S. Provisional Application No. 62/341,004, filed May 24, 2016, entitled "SACRIFICIAL NON-EPITAXIAL GATE STRESSORS", the entire content of which is incorporated herein by reference.

FIELD

One or more aspects of embodiments according to the present invention relate to strained channel field effect transistors, and more particularly to a method for fabricating field effect transistors with a strained channel.

BACKGROUND

Strained channel field effect transistors may exhibit performance characteristics differing from, and in some circumstances superior to, those of unstrained channel field effect transistors. Related art methods of fabricating strained channel field effect transistors may have various drawbacks. For example, the use of source drain (SD) stressors may become less efficient with scaling due to smaller SD volume. Also, SD stressors may be poorly suited for achieving tensile strained channels in n-type metal oxide semiconductor (nMOS) devices. Flows with built in stressed layers as starting material and flows using underlayer stressors may face difficulties in maintaining the stress through the fabrication flow, losing, for example, most of the initial stress. In particular, stress may be lost during deep SD recess and/or fin cut, due to elastic relaxation. This strain loss (i.e., the loss of the strain in the channels due to the loss of the initial stress) may not be fully recovered during SD epitaxial regrowth. With significant effort in the epitaxial SD regrowth module, some strain may be partially recovered, but in some cases practically no strain recovery occurs at this module. If the deep SD recess is eliminated and epitaxial growth is added on top of the fin structure on the SD, without previously performing a SD recess, poor doping profiles may result.

Thus, there is a need for a method for fabricating strained channel field effect transistors that addresses these challenges.

SUMMARY

Aspects of embodiments of the present disclosure are directed toward a method for fabricating a fin field effect transistor (finFET) device with a strained channel. During fabrication, after the fin is formed, a dummy gate is deposited on the fin, and processed, e.g., by plasma doping and annealing, to cause stress in the dummy gate. Deep source drain (SD) recesses are formed, resulting in strain in the channel, and SD structures are formed to anchor the ends of the fin. The dummy gate is then removed.

According to an embodiment of the present invention there is provided a method for fabricating a strained channel for a fin field effect transistor (finFET) device having a fin including the channel, the method including: forming, on the fin, a dummy gate, a portion of the dummy gate being under a stress of at least 200 megapascals (MPa); forming a first source drain recess at a first end of the fin; forming a second source drain recess at a second end of the fin; forming a first source drain within the first source drain recess; forming a second source drain within the second source drain recess; and removing the dummy gate.

In one embodiment, the portion of the dummy gate is under a stress of at least 300 MPa.

In one embodiment, the portion of the dummy gate is under a stress of at least 500 MPa.

In one embodiment, the dummy gate includes an insulating layer directly on the fin, the insulating layer having a thickness of less than 5 nanometers (nm).

In one embodiment, the insulating layer has a thickness of less than 3 nanometers (nm).

In one embodiment, the insulating layer includes, as a major component, an oxide.

In one embodiment, the forming of the dummy gate includes: forming an insulating layer, of a first material, having a thickness of less than 5 nm, directly on the fin; and forming a layer of a second material directly on the insulating layer, the second material being capable of developing a compressive or tensile stress in response to a process selected from the group consisting of ion implantation, plasma doping, annealing, and combinations thereof.

In one embodiment, the fin has a thickness less than about 8 nm.

In one embodiment, the forming of the first source drain recess includes forming the first source drain recess to a depth of at least about 10 nm; and the forming of the second source drain recess includes forming the second source drain recess to a depth of at least about 10 nm.

In one embodiment, the forming of the first source drain includes growing the first source drain as an epitaxial layer; and the forming of the second source drain includes growing the second source drain as an epitaxial layer, a strain state in the channel after the forming of the first source drain and the forming of the second source drain having a strain greater, by at least 10%, than a strain of the strain state in the channel before the forming of the first source drain and the forming of the second source drain.

In one embodiment, the forming of the first source drain includes growing the first source drain as an epitaxial layer; and the forming of the second source drain includes growing the second source drain as an epitaxial layer, a strain state in the channel after the forming of the first source drain and the forming of the second source drain having a strain differing from a strain of the strain state in the channel before the forming of the first source drain and the forming of the second source drain by no more than 30%.

In one embodiment, the strain of the strain state in the channel after the forming of the first source drain and the forming of the second source drain differs from the strain of the strain state in the channel before the forming of the first source drain and the forming of the second source drain by no more than 10%.

In one embodiment, the forming of the first source drain includes growing the first source drain as a non-epitaxial layer; and the forming of the second source drain includes growing the second source drain as a non-epitaxial layer, a strain state in the channel after the forming of the first source drain and the forming of the second source drain having a strain differing from a strain of the strain state in the channel before the forming of the first source drain and the forming of the second source drain by no more than 30%.

In one embodiment, the strain of the strain state in the channel after the forming of the first source drain and the forming of the second source drain differs from the strain of the strain state in the channel before the forming of the first source drain and the forming of the second source drain by no more than 10%.

In one embodiment, the finFET device is an n-type metal oxide semiconductor device.

In one embodiment, the finFET device is a p-type metal oxide semiconductor device.

In one embodiment, the first source drain is composed of: silicon, or silicon germanium including at least 30% germanium.

According to an embodiment of the present invention there is provided a method for fabricating a strained channel for a fin field effect transistor (finFET) device having a fin including the channel, the method including: forming, on the fin, a dummy gate; forming a first source drain recess at a first end of the fin; forming a second source drain recess at a second end of the fin; forming a first source drain within the first source drain recess; forming a second source drain within the second source drain recess; and removing the dummy gate; the forming of the dummy gate including: forming a first layer, of a first material, having a thickness of less than 5 nm, directly on the fin; forming a second layer, of a second material, directly on the first layer; incorporating one or more additional elements into the second layer; and annealing the second layer at a temperature of at least 700 C and at most 1000 C, the incorporating of the one or more additional elements including utilizing a process selected from the group consisting of plasma doping, ion implantation, and combinations thereof, the additional elements being selected from arsenic, phosphorus, and combinations thereof, the incorporating of the one or more additional elements including incorporating one or more additional elements at a total dose of at least 1e15 cm$^{-2}$ and at most 5e16 cm$^{-2}$, and the incorporating of the one or more additional elements into the second layer resulting in sufficiently little incorporating of the one or more additional elements into the fin to avoid affecting electrical characteristics of the finFET device.

In one embodiment, the method includes incorporating one or more additional elements at a total dose of about 1e15 cm$^{-2}$, and the annealing of the second layer includes annealing of the second layer at a temperature of about 900 C.

According to an embodiment of the present invention there is provided a method for straining a fin of a fin field effect transistor (FinFET) device, the fin being substantially a single crystal, the method including: forming, on the fin, a dummy gate; forming a first source drain recess at a first end of the fin; forming a second source drain recess at a second end of the fin; forming a first source drain within the first source drain recess; forming a second source drain within the second source drain recess; removing the dummy gate; and forming a replacement metal gate, the forming of the dummy gate including: forming a first layer, of a first material, having a thickness of less than 5 nm, directly on the fin; forming a second layer, of a second material, directly on the first layer; incorporating one or more additional elements into the second layer; and forming a third layer directly on the second layer, a total height of the first layer, the second layer, and the third layer being substantially the same as a total height of the replacement metal gate.

BRIEF DESCRIPTION OF THE DRAWINGS

These and other features and advantages of the present invention will be appreciated and understood with reference to the specification, claims, and appended drawings wherein:

DETAILED DESCRIPTION

The detailed description set forth below in connection with the appended drawings is intended as a description of exemplary embodiments of a method for straining a fin field effect transistor (finFET) channel provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Embodiments of the present invention are directed to a method to fabricate strained channel fin field effect transistor (finFET) devices based on the use of a sacrificial non-epitaxial gate stressor. The fabrication flow includes the steps (acts) of formation of the sacrificial non-epitaxial gate stressor (or "dummy gate") and corresponding spacers, the formation of deep source drain (SD) recesses or fin cuts in order to elastically relax the structure formed by the fin and sacrificial non-epitaxial gate stressor, the filling of the SD recess or fin cuts, and the removal of the sacrificial non-epitaxial gate stressor selectively to the channel material during the replacement metal gate (RMG) module.

In the following, an example of a method according to an embodiment of the present invention is presented. One of skill in the art will understand that there are many possible ways to implement a sacrificial non-epitaxial gate stressor. The flow presented is an exemplary flow, and many modifications are possible at various steps. Particularly, any variations used in related art flows at different steps in the flow may be incorporated when suitable. Not every step in the flow is described, as some steps may be similar to those in related art flows. It will be understood that additional fabrication steps precede the steps described, may be intercalated between the steps described, or may follow the steps described. A flow for fin on bulk is shown as an example, but the invention is applicable to fin on insulator structures as well. It will be understood that several parts of the flows may be performed in nMOS and p-type metal oxide semiconductor (pMOS) devices separately, with the other type of device masked. The flow starts with fin formation as in standard fin flows, with formation of fin structures in which the fin structures are substantially single crystal structures.

Figure 1:
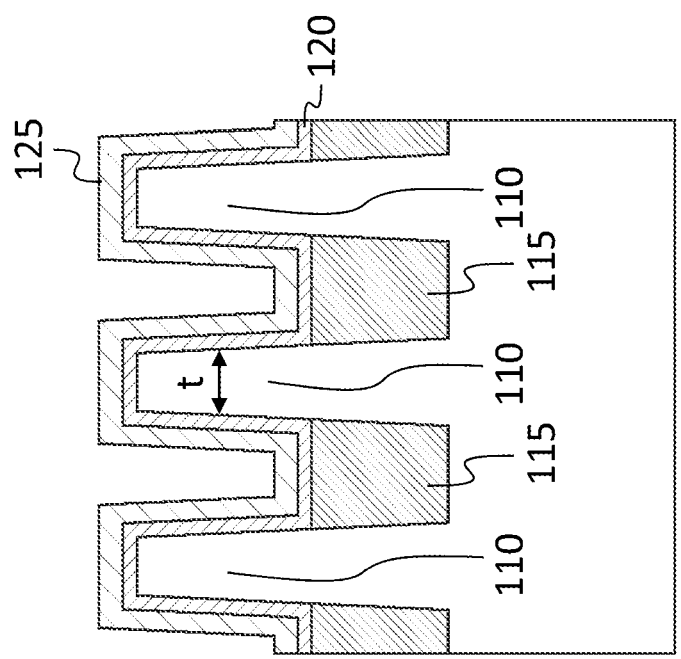
FIG. 1 is a schematic cross-sectional view of an intermediate structure in a method for fabricating a strained channel field effect transistor, according to an embodiment of the present invention.

FIG. 1 shows an intermediate structure that may result after the steps of forming fins 110 separated by shallow trench shallow trench isolation structures 115, and depositing a thin insulating layer 120 and a layer 125 of amorphous silicon (a-Si) on the fins 110 and the shallow trench shallow trench isolation structures 115. The insulating layer 120 may be an oxide layer, for example, and it may have a thickness of between 3 nanometers (nm) and 5 nm, or of less than 3 nm. The fins may be composed of silicon or silicon germanium and each fin 110 may be substantially a single crystal. In some embodiments a layer of polycrystalline silicon is formed instead of the amorphous silicon layer 125. The amorphous silicon layer 125, or the layer of polycrystalline silicon, may have a thickness of between 2 nm and 10 nm, e.g., it may have a thickness of 2 nm to 4 nm, or of 5 nm, or of 10 nm.

Figure 2:
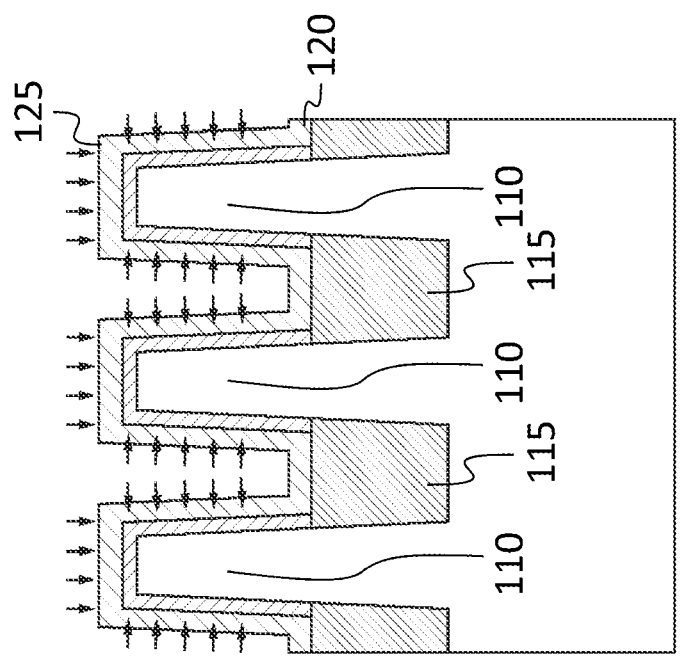
FIG. 2 is a schematic cross-sectional view of an intermediate structure in a method for fabricating a strained channel field effect transistor, according to an embodiment of the present invention.

Referring to FIG. 2, in a subsequent step, plasma doping (PLAD) may be utilized to incorporate arsenic (As), e.g., at a density of between $1e15$ $cm^{-2}$ and $1e16$ $cm^{-2}$ (e.g., at a density of $5e15$ $cm^{-2}$) into the amorphous silicon layer 125. The portions of the oxide layer 120 that are shown in FIG. 1 as being directly on the shallow trench isolation structures 115 are not shown in FIGS. 2, 3, and 4A, but may nonetheless be present, in some embodiments.

Figure 3:
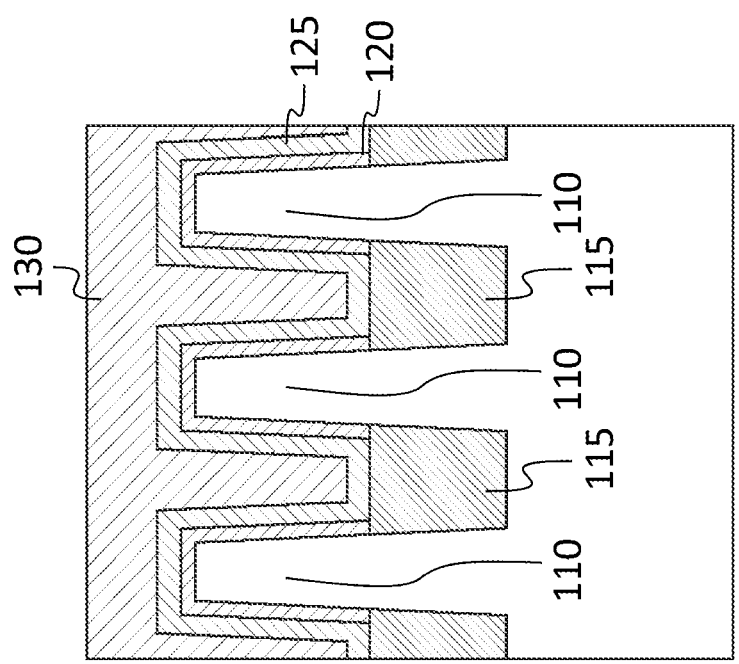
FIG. 3 is a schematic cross-sectional view of an intermediate structure in a method for fabricating a strained channel field effect transistor, according to an embodiment of the present invention.
Figure 4A:
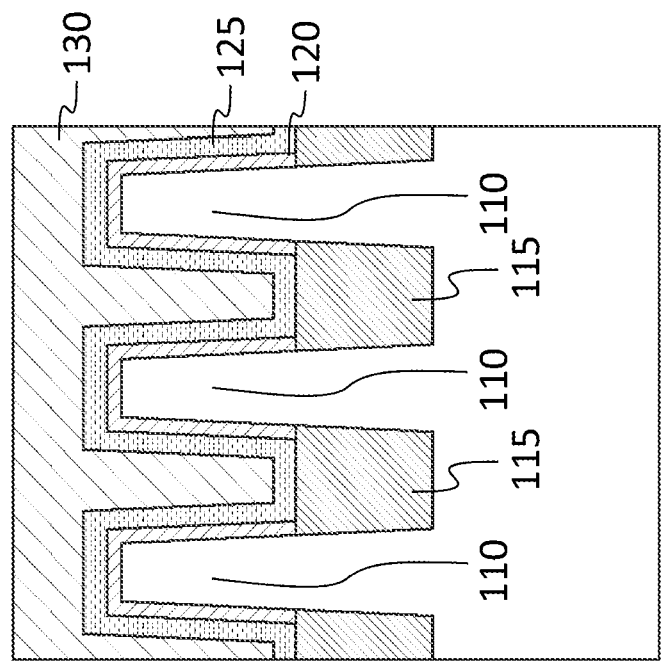
FIG. 4A is a schematic cross-sectional view of an intermediate structure in a method for fabricating a strained channel field effect transistor, according to an embodiment of the present invention.

A layer 130 of polycrystalline silicon (poly-Si) may be deposited over the amorphous silicon layer 125 to form the intermediate structure illustrated in FIG. 3. An annealing process may then be used to cause grain growth, resulting in the intermediate structure illustrated in FIGS. 4A and 4B, in which alternate cross hatching has been used to indicate material with larger grains. In some embodiments, the annealing step is performed at a temperature of 700 C to 1000 C, e.g., at about 900 C.

The drawings of FIGS. 1-4A are cross sectional views showing each of three fins end-on; FIG. 4B (and FIGS. 5-8, discussed below) are broadside cross sectional views, taken through a fin, in which the length direction of the fin is transverse and horizontal in the image. Accordingly, the thickness (labeled "t" in FIG. 1) of the fins may be seen in FIGS. 1-4A, and the direction along the lengths of the fins may be seen in FIGS. 5-8.

The combination of the insulating layer 120, the amorphous silicon layer 125, and the polycrystalline silicon layer 130 may be planarized by methods known in prior art fabrication flows, including the deposition of additional layers such as oxides, and chemical mechanical polishing (CMP) steps. As in related art flows, additional capping layers may be deposited after planarization, and the structure may be then patterned (i.e., etched) to form a plurality or structures each having the shape of, and subsequently acting as a template for, a gate of the finFET formed during subsequent processing steps (e.g., using an RMG process). Accordingly, each of these structures may be referred to as a "dummy gate". Spacer formation may follow as in known related art flows.

Figure 4B:
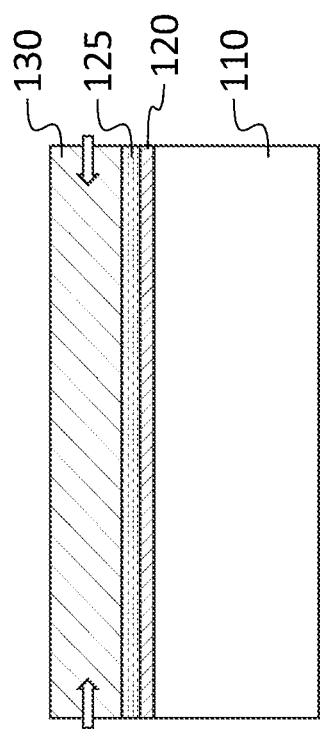
FIG. 4B is a schematic cross-sectional view of an intermediate structure in a method for fabricating a strained channel field effect transistor, according to an embodiment of the present invention.
Figure 5:
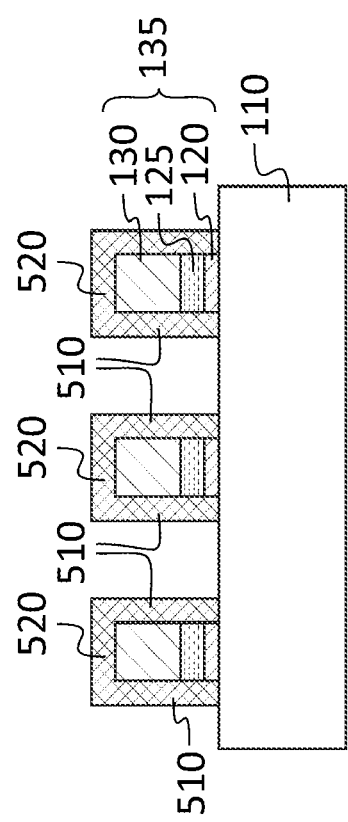
FIG. 5 is a schematic cross-sectional view of an intermediate structure in a method for fabricating a strained channel field effect transistor, according to an embodiment of the present invention.

FIG. 5 shows an intermediate structure that may result after the steps of forming dummy gates 135 with insulating caps 520, and spacers 510. Arrows in FIG. 4B show the direction of a compressive stress formed in the dummy gate 135. The stress may be compressive as shown, and may be more than 200 megapascals (MPa), or more than 300 MPa, or more than 500 MPa. In other embodiments, the stress may be tensile, and may be more than 200 MPa, or more than 300 MPa, or more than 500 MPa.

The spacers 510 may be composed of a nitride, and the insulating caps 520 may also be composed of a nitride. In some embodiments, more complex layered structures involving more than one material may be used for the spacers and/or for the caps, as known in the art.

Figure 6:
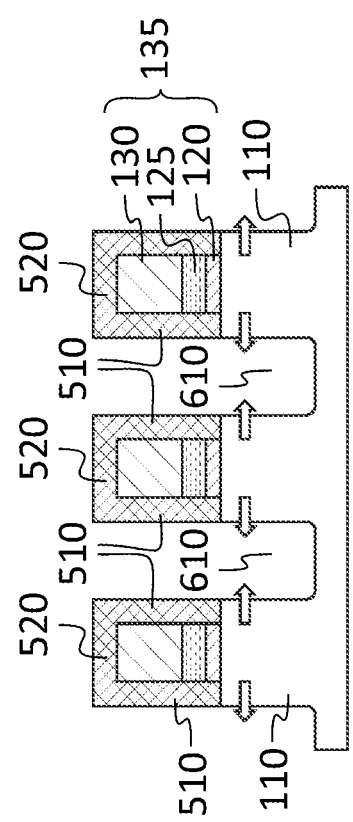
FIG. 6 is a schematic cross-sectional view of an intermediate structure in a method for fabricating a strained channel field effect transistor, according to an embodiment of the present invention.

FIG. 6 shows an intermediate structure that may result after the steps of forming deep source drain SD recesses 610. Deep SD recesses 610 may be formed by etching the fin material (as in related art steps to form deep SD recesses). Each SD recess 610 may extend nearly to the bottom of the fin (i.e. to a height close to the surface plane of the shallow trench isolation structures 115). Deep SD recesses 610 allow the fin and the dummy gates 135 in between the SD recesses to relax elastically. Accordingly, stress is transferred to the channel (i.e., to the fin 110) by elastic relaxation of the entire structure at the deep SD recesses 610.

Figure 7:
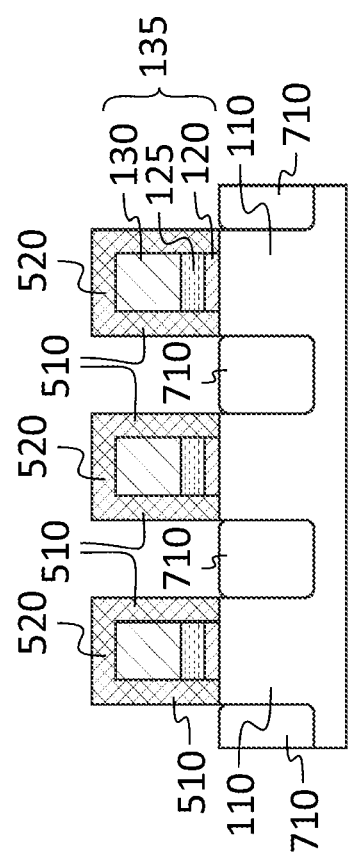
FIG. 7 is a schematic cross-sectional view of an intermediate structure in a method for fabricating a strained channel field effect transistor, according to an embodiment of the present invention.

FIG. 7 shows an intermediate structure that may result after subsequently performed SD regrowth. A relaxed SD 710 may be epitaxially regrown (allowing defect formation in the epitaxially regrown SD material) so that strain in the channel is preserved. This may be readily achieved by one of skill in the art; indeed achieving a SD regrowth that would change the stress state of the channel as from the state before SD regrowth may be more challenging than re-growing the SDs 710 in a way that does not change the strain in the channel from the state before SD regrowth. In some embodiments, the SD 710 is filled or regrown with non-epitaxial material, also without changing the strain state in the channel significantly. The refilled and/or regrown SDs 710 may then act as pinning structures to anchor the ends of the fin and hold the strain in the channel at the sacrificial epitaxial gate removal step. In some embodiments, described in further detail below, the SDs 710 are grown so as to also enhance the strain in the fin 110 (and in the channel).

In some embodiments, a SD regrowth which grows coherently with the fin crystal, so that it may change the strain state of the channel during growth, may be advantageous. An example is for pMOS fins; a mid- or high-Ge SiGe SD 710 may add additional compressive strain to the channel. These implementations are not precluded from the scope of the present invention, and may be used to further boost strain in the channel.

The growth of SD stressors (i.e., SDs 710 that impart additional strain to the channel, and during the growth of which the strain state in the channel changes) may be significantly more challenging to implement in structures like horizontal nano-sheets (hNS) or horizontal nanowires (hNW), since in these cases, the SD may be nucleating and growing from multiple surfaces (bottom, end of each nano-sheet or nano-wire) which in most cases will not have the registry of a single crystal (i.e., there is no single crystal that matches all these surfaces coherently). When the different grow-fronts (most of which may be unstrained as they meet) meet, defects may be formed (e.g., low angle grain boundaries, stacking faults, etc.). The relative ease of using the methods described herein for fin structures (as compared with hNS and hNW structures) may make fin structures more attractive than hNS or hNW in some suitable applications.

In some fin flows using some initially strained fin material (e.g., fin on a strain-relaxed buffer (SRB) layer) it may be difficult to recover the strain loss resulting from the deep SD recess (or fin cut) by re-growing the epitaxially grown SD 710. While this may be a problem for fin flows that rely on underlayer stressors like SRB, in embodiments of the present invention it may be an advantage.

In some embodiments, the SD 710 is grown or deposited in a way that does not change substantially the strain state in the channel (compared to the strain state before SD growth or deposition). In some embodiments, an epitaxial material may be used that has a different lattice parameter than the material removed in the deep SD recess, so that an additional strain (of the same type as that present in the channel immediately after performing the deep SD recess) may be obtained. In some embodiments the SD regrowth is done by growth of an epitaxial layer. In some embodiments, this epitaxial layer may have defects. In some embodiments, the SD refill is deposited in this step and does not grow epitaxially. In some embodiments, the SD regrowth or refill results in a SD 710 that is substantially of the same height or taller than the material removed at the SD recess step, i.e., in the top of the SD 710 after this step may be about level with, or taller than, the fin top surface at the channel.

As in typical art flows, an insulating layer such as an oxide (not shown in drawings) is then deposited and planarized, and left covering the SD regions but giving access to the top of the dummy gates for the replacement metal gate (RMG) module.

Figure 8:
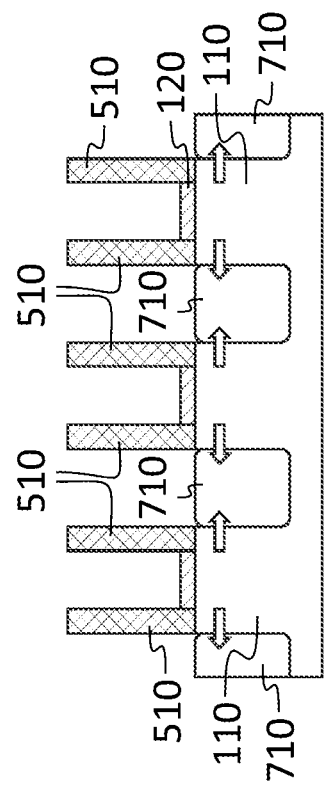
FIG. 8 is a schematic cross-sectional view of an intermediate structure in a method for fabricating a strained channel field effect transistor, according to an embodiment of the present invention.

FIG. 8 shows an intermediate structure that may result after the dummy gates 135 are removed in the replacement metal gate module. The portion of the stress along the channel may be held or anchored by the SDs 710, and other stress components may be relaxed due to free surfaces. Arrows in FIG. 8 show the tensile channel strain that may result. The removal of the dummy gates 135 may be performed in the RMG module, and may include the removal of the insulating layer 120 (e.g., the dummy gate oxide layer) as well. Subsequently performed replacement metal gate (RMG) formation (which may include the steps of interface layer (IL) formation, high-k (HK) formation, and metal gate formation), and the remainder of the fabrication steps, may follow as in related art fin flows.

In some embodiments, the dummy gates 135 are under compressive stress (as illustrated, for example, by the arrows of FIG. 4B) when the flow reaches the SD module. This may be appropriate for n-type metal oxide semiconductor (nMOS) devices silicon channel devices, to create a tensile channel strain in such devices. In some embodiments the dummy gates 135 may instead be under tensile stress when the flow reaches the SD module; this may be appropriate for p-type metal oxide semiconductor (pMOS) silicon channel devices, to create a compressive channel strain.

The annealing step may be performed at other points in the flow after the arsenic incorporation (or the incorporation of other elements that may be used instead of, or in addition to, arsenic) and before the formation of the deep SD recesses 610. In some embodiments, as discussed above, the annealing step is performed before the step of patterning dummy gates 135. In other embodiments, the anneal may be performed before the deposition of the polycrystalline silicon layer 130, or after dummy gate patterning (but before the formation of spacers 510 and deep SD recesses 610). In other embodiments, the anneal may be performed after dummy gate patterning and the formation of spacers 510 (but before the formation of deep SD recesses 610). In other embodiments an anneal is performed after As incorporation but before dummy gate deposition to full thickness is completed (i.e. an anneal is performed after the step illustrated in FIG. 2, and before the subsequent formation of the polycrystalline silicon layer 130).

In some embodiments, the element incorporated in the step illustrated in FIG. 2 is phosphorus (P) instead of arsenic. In other embodiments, both arsenic and phosphorus, or other combinations of elements that may or not include arsenic or phosphorus, are incorporated in the step illustrated in FIG. 2. In some embodiments, the incorporation of one or more other elements, in the step illustrated in FIG. 2, is accomplished by ion implantation, or through impingement of clusters containing the elements to be incorporated. Flows employed with embodiments of the present invention may be on bulk or on "on insulator" (OI) substrates (e.g., silicon on insulator (SOI), germanium on insulator (GeOI), or in general semiconductor on insulator (XOI)).

Embodiments of the present invention may be complimentary to methods for generating fin strain by SD epitaxial stressors, and in principle SD stressors may be added to the flows of embodiments of the present invention as additional stressors. In any case, with scaling, the volume of SD material may be reduced and the amount of strain possible from SD stressors may be reduced. Also, SD stressors may be challenging to implement to achieve tensile strained channels in nMOS devices. Embodiments of the present invention may facilitate the generation of tensile channel strain for nMOS devices.

In fin processes in which the final fin has layers of different materials, (e.g. a Si core and strained SiGe on top for pMOS), the stressor layers may remain in the final fin structure (i.e., they may not be removed during processing). When the final fin structure contains several layers, the fin width may be larger in order to accommodate the different layers at reasonable thicknesses. This may make electrostatic control more difficult and may also make it more difficult to fabricate devices with tight fin pitches. By contrast, in embodiments of the present invention, the stressor layer may be removed and so the final fin may be relatively thin (e.g. about 5-8 nm), facilitating electrostatic control.

The use of sacrificial epitaxial stressor layers grown around the whole fin structure before the dummy gate module may involve the use of internals spacers to avoid large parasitic capacitance, and processing may be challenging if the gap between fins is to be filled quite fully with the sacrificial stressor layer or later in the flow with internal spacer material, to prevent large parasitic capacitance. By contrast, in embodiments of the present invention, which may avoid the use of internal spacers to lower parasitic capacitance, these issues may be avoided.

In light of the foregoing, channel strain may be created in a finFET by depositing a sacrificial non-epitaxial gate stressor on the fin, causing strain in the fin, forming SD structures to anchor the ends of the fin, and then removing the sacrificial non-epitaxial gate stressor.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," "used," and "step" may be considered synonymous with the terms "utilize," "utilizing," and "utilized," and "act," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a method for straining a fin field effect transistor (finFET) channel have been specifically described and illustrated herein, many modifications and variations will be apparent to those skilled in the art. Accordingly, it is to be understood that a method for straining a fin field effect transistor (finFET) channel according to principles of this invention may be embodied other than as specifically described herein. The invention is also defined in the following claims, and equivalents thereof.

What is claimed is:

1. A method for fabricating a strained channel for a fin field effect transistor (finFET) device having a fin comprising the channel, the method comprising:
    forming, on the fin, a dummy gate to create strain in the channel, a portion of the dummy gate being under a stress of at least 200 megapascals (MPa);
    forming a first source drain recess at a first end of the fin;
    forming a second source drain recess at a second end of the fin;
    forming a first source drain within the first source drain recess;
    forming a second source drain within the second source drain recess; and
    removing the dummy gate.

2. The method of claim 1, wherein the portion of the dummy gate is under a stress of at least 300 MPa.

3. The method of claim 1, wherein the portion of the dummy gate is under a stress of at least 500 MPa.

4. The method of claim 1, wherein the dummy gate comprises an insulating layer directly on the fin, the insulating layer having a thickness of less than 5 nanometers (nm).

5. The method of claim 4, wherein the insulating layer has a thickness of less than 3 nanometers (nm).

6. The method of claim 4, wherein the insulating layer comprises, as a major component, an oxide.

7. The method of claim 1, wherein the forming of the dummy gate comprises:
    forming an insulating layer, of a first material, having a thickness of less than 5 nm, directly on the fin; and
    forming a layer of a second material directly on the insulating layer, the second material being capable of developing a compressive or tensile stress in response to a process selected from the group consisting of ion implantation, plasma doping, annealing, and combinations thereof.

8. The method of claim 1, wherein the fin has a thickness less than about 8 nm.

9. The method of claim 1, wherein:
    the forming of the first source drain recess comprises forming the first source drain recess to a depth of at least about 10 nm; and the forming of the second source drain recess comprises forming the second source drain recess to a depth of at least about 10 nm.

10. The method of claim 1, wherein:
the forming of the first source drain comprises growing the first source drain as an epitaxial layer; and
the forming of the second source drain comprises growing the second source drain as an epitaxial layer,
a strain state in the channel after the forming of the first source drain and the forming of the second source drain having a strain greater, by at least 10%, than a strain of the strain state in the channel before the forming of the first source drain and the forming of the second source drain.

11. The method of claim 1, wherein:
the forming of the first source drain comprises growing the first source drain as an epitaxial layer; and
the forming of the second source drain comprises growing the second source drain as an epitaxial layer,
a strain state in the channel after the forming of the first source drain and the forming of the second source drain having a strain differing from a strain of the strain state in the channel before the forming of the first source drain and the forming of the second source drain by no more than 30%.

12. The method of claim 11, wherein the strain of the strain state in the channel after the forming of the first source drain and the forming of the second source drain differs from the strain of the strain state in the channel before the forming of the first source drain and the forming of the second source drain by no more than 10%.

13. The method of claim 1, wherein the finFET device is an n-type metal oxide semiconductor device.

14. The method of claim 1, wherein the finFET device is a p-type metal oxide semiconductor device.

15. The method of claim 14, wherein the first source drain is composed of:
silicon, or
silicon germanium including at least 30% germanium.

16. A method for fabricating a strained channel for a fin field effect transistor (finFET) device having a fin comprising the channel, the method comprising:
forming, on the fin, a dummy gate, a portion of the dummy gate being under a stress of at least 200 megapascals (MPa);
forming a first source drain recess at a first end of the fin;
forming a second source drain recess at a second end of the fin;
forming a first source drain within the first source drain recess;
forming a second source drain within the second source drain recess; and
removing the dummy gate,
wherein:
the forming of the first source drain comprises growing the first source drain as a non-epitaxial layer; and
the forming of the second source drain comprises growing the second source drain as a non-epitaxial layer,
a strain state in the channel after the forming of the first source drain and the forming of the second source drain having a strain differing from a strain of the strain state in the channel before the forming of the first source drain and the forming of the second source drain by no more than 30%.

17. The method of claim 16, wherein the strain of the strain state in the channel after the forming of the first source drain and the forming of the second source drain differs from the strain of the strain state in the channel before the forming of the first source drain and the forming of the second source drain by no more than 10%.

18. A method for fabricating a strained channel for a fin field effect transistor (finFET) device having a fin comprising the channel, the method comprising:
forming, on the fin, a dummy gate;
forming a first source drain recess at a first end of the fin;
forming a second source drain recess at a second end of the fin;
forming a first source drain within the first source drain recess;
forming a second source drain within the second source drain recess; and
removing the dummy gate;
the forming of the dummy gate comprising:
forming a first layer, of a first material, having a thickness of less than 5 nm, directly on the fin;
forming a second layer, of a second material, directly on the first layer;
incorporating one or more additional elements into the second layer; and
annealing the second layer at a temperature of at least 700 C and at most 1000 C,
the incorporating of the one or more additional elements comprising utilizing a process selected from the group consisting of plasma doping, ion implantation, and combinations thereof,
the additional elements being selected from arsenic, phosphorus, and combinations thereof,
the incorporating of the one or more additional elements comprising incorporating one or more additional elements at a total dose of at least 1e15 $cm^{-2}$ and at most 5e16 $cm^{-2}$, and
the incorporating of the one or more additional elements into the second layer resulting in sufficiently little incorporating of the one or more additional elements into the fin to avoid affecting electrical characteristics of the finFET device.

19. The method of claim 18, wherein the incorporating of the one or more additional elements comprising incorporating one or more additional elements at a total dose of about 1e15 $cm^{-2}$, and the annealing of the second layer comprises annealing of the second layer at a temperature of about 900 C.

20. A method for straining a fin of a fin field effect transistor (FinFET) device, the fin being substantially a single crystal, the method comprising:
forming, on the fin, a dummy gate;
forming a first source drain recess at a first end of the fin;
forming a second source drain recess at a second end of the fin;
forming a first source drain within the first source drain recess;
forming a second source drain within the second source drain recess;
removing the dummy gate; and
forming a replacement metal gate,
the forming of the dummy gate comprising:
forming a first layer, of a first material, having a thickness of less than 5 nm, directly on the fin;
forming a second layer, of a second material, directly on the first layer;
incorporating one or more additional elements into the second layer; and
forming a third layer directly on the second layer, a total height of the first layer, the second layer, and the third layer being substantially the same as a total height of the replacement metal gate.

\* \* \* \* \*